United States Patent
Drapkin et al.

(10) Patent No.: US 6,400,546 B1
(45) Date of Patent: Jun. 4, 2002

(54) I/O PAD VOLTAGE PROTECTION CIRCUIT AND METHOD

(75) Inventors: Oleg Drapkin, Richmond Hill; Grigori Temkine, Toronto, both of (CA)

(73) Assignee: Ati International Srl (BB)

( * ) Notice: Subject to any disclaimer, the term of this patent is extended or adjusted under 35 U.S.C. 154(b) by 0 days.

(21) Appl. No.: 09/388,988

(22) Filed: Sep. 2, 1999

(51) Int. Cl.⁷ .................................. H02H 3/22
(52) U.S. Cl. .................... 361/111; 361/56; 327/310
(58) Field of Search .................... 361/54, 56, 88, 361/90, 91.1, 91.4, 92, 111; 257/355, 357; 327/306, 309, 310, 318

(56) References Cited

U.S. PATENT DOCUMENTS

| | | |
|---|---|---|
| 5,534,811 A | 7/1996 | Gist et al. |
| 5,852,540 A | * 12/1998 | Haider ............... 361/111 |
| 5,923,202 A | * 7/1999 | Merrill ............... 327/318 |
| 6,008,665 A | * 12/1999 | Kalb et al. ............... 326/30 |
| 6,049,445 A | * 4/2000 | Gauthier, Jr. et al. ......... 361/56 |

FOREIGN PATENT DOCUMENTS

DE 197 38 181 A 1 9/1998

WO WO19657 A 7/1995

OTHER PUBLICATIONS

European Search Report EP 00 30 7497, 00307497.8–2214 dated Dec. 18, 2000.

* cited by examiner

Primary Examiner—Kim Huynh
(74) Attorney, Agent, or Firm—Vedder, Price, Kaufman & Kammholz

(57) ABSTRACT

An I/O pad voltage protection circuit and method tracks a bias voltage of cascaded stages in order to avoid overvoltage stress in I/O transistors. An overshoot protection circuit controls overshoot current sinking to provide a clamp voltage equal to an I/O pad supply voltage, or other suitable reference voltage, during overshoot conditions, as a function of a reference voltage generated by a reference voltage generating circuit. An undershoot protection circuit includes a reference voltage generating circuit and controls undershoot current sinking to provide a clamp voltage approximately equal to an I/O pad ground voltage, or other suitable reference voltage, during undershoot conditions as a function of a reference voltage generated by the second reference voltage generating circuit.

18 Claims, 4 Drawing Sheets

I/O PAD VOLTAGE PROTECTION CIRCUIT AND METHOD

Related co-pending application. This application is related to co-pending application entitled Input State Protection Circuit for a Receiver, filed on Mar. 19, 1999, having Ser. No. 09/272,857, having the same inventors and owned by instant Assignee.

FIELD OF THE INVENTION

The invention relates generally to overvoltage and combined undervoltage protection circuits for protecting other circuits from higher and lower than desired voltage levels, and more particularly to voltage scaling circuits for protecting an input to a protected circuit.

BACKGROUND OF THE INVENTION

With the continued demand for higher speed and lower power consumption integrated circuits a need exists for simple, low cost and reliable over voltage and undervoltage protection circuits. For example, CMOS based video graphics chips with 128 input/output ports (I/O) ports are required to operate at clock speeds in excess of 250 MHz. Such devices may use a 1.8 V power supply for much of its logic to reduce power consumption. One way to increase the operating speed of such devices is to decrease the gate oxide thickness and gate length of core circuitry transistors. However, a decrease in the gate oxide thickness and gate length of MOS devices can reduce the gate-source (gate-drain) operating voltage to lower levels. For example, where an integrated circuit contains digital circuitry that operates from a 1.8 V source and is fabricated using silicon dioxide gate thickness of 30 Å, a resulting maximum operating voltage may be approximately 2.3 volts. Such IC's must often connect with more conventional digital devices that operate at or 3.3 V. A problem arises when the core logic circuitry (operating, for example, at 1.8 V) receives 3.3 V digital input signals from peripheral devices on input pins. Such standard 3.3 V input signals can cause gate oxide damage if suitable voltage protection is not incorporated.

FIG. 1 shows a known over voltage protection arrangement that attempts to overcome the overvoltage problem. As seen, a resistor R is placed in the input path from an input pin P to the input I of a MOS based core logic stage, such as an input/output port on a CPU or other processing unit. A clamping diode D is placed across the input I of the core logic stage and is connected to a 2.5 V supply voltage used by the core logic to clamp over voltages coming from pin P. In operation, resistor R restricts current flow to the core logic circuit and a voltage drop occurs across the resistor. When an input voltage is high enough to cause the diode D to conduct, the diode clamps the input voltage to a fixed level (2.5 V+diode junction voltage drop). Several problems arise with such a configuration. If the core logic is fabricated with gate oxide thickness of 50 Å, an input voltage of only 2.8 V is required to damage the core logic stage. With the diode drop of approximately 0.7 volts, a 3.5 V input voltage is a maximum input voltage to the core logic stage. However, with this 3.5 V level of damage voltage over temperature and time, circuit reliability may be compromised. This problem is more prevalent as the core logic supply voltage is reduced to 1.8V and the gate thickness is based on 0.18 um technology wherein the gate thickness is on the order of 30 Å or smaller gate thicknesses. Also, the clamp diode D allows additional current to flow through the substrate which can cause latch-up of core logic circuitry.

Another problem is the use of resistor R. Such resistive elements take up large areas on integrated circuits and dissipate large amounts of power, hence heat, when an input voltage such as 5 volts is placed on pin P. In addition, a large time delay can occur due to the resistor R and the parasitic capacitance of the gate junction of the core logic circuit. This time delay reduces the speed of operation of the system.

In addition, receivers may also experience undervoltage conditions, such as negative voltage undershooting due to different ground potentials between the peripheral circuitry and the receiver circuitry. With higher speed circuits, such as those using 0.18 micrometer MOS gate length (30A gate thickness), and having a 1.8 V supply voltage, such circuits may have to receive higher input voltages such as 3.3 V from peripheral circuits. An undesirable undervoltage condition, such as a −0.8 V input signal may be experienced. As such, for a 1.8 V based receiver, the input on a node may experience a total potential of 1.8 V plus 0.8 V resulting in a 2.6 V potential across a gate to drain or gate to source of a receiver transistor. This potential is typically higher than the safe gate/source or gate/drain operating voltage range (2.3 V) and can damage the receiver MOS devices. Accordingly, it would be desirable to control an input voltage to a receiver such that undervoltage conditions and overvoltage conditions do not damage the receiver circuitry or the core logic circuitry or other circuit that has to be protected.

Moreover, there are different voltage supplies that are being used to power CMOS chip cores and I/O pads as well as different voltage level of input signals that are received or operated by the I/O pads. For example, with 0.18 micrometer technology, the core voltage may be 1.8 V based supply and I/O pad circuitry may be 2.5 V or 3.3. As such, the voltage level of the input signals to the I/O pads may be 2.5 V or 3.3 V. If it is desired to make a single gate oxide core logic and I/O pad logic, greater chips speeds and power reduction can occur. However, the 2.5 V or 3.3 V input signals could damage such transistors. In addition, as mentioned above, input signals can have an undershoot of more then 0.4V.

Consequently there exists a need for a protection circuit that improves the speed of operation of a system in a simple and reliable manner. It would desirable if the protection circuit provided protection against both overshoot and undershoot voltages in a cost effective manner.

DETAILED DESCRIPTION OF A PREFERRED EMBODIMENT OF THE INVENTION

Briefly, an I/O pad voltage protection circuit and method tracks a bias voltage of cascaded stages in order to avoid overvoltage stress in I/O transistors. An overshoot protection circuit controls overshoot current sinking to provide a clamp voltage equal to an I/O pad supply voltage, or other suitable reference voltage, during overshoot conditions, as a function of a reference voltage generated by a reference voltage generating circuit. An undershoot protection circuit includes a reference voltage generating circuit and controls undershoot current sinking to provide a clamp voltage approximately equal to an I/O pad ground voltage, or other suitable reference voltage, during undershoot conditions as a function of a reference voltage generated by the second reference voltage generating circuit.

In one embodiment, a floating level protection circuit, such as a pull up resistive element, provides a dynamically floating reference signal to the overshoot protection circuit and to the undershoot protection circuit to provide a gate to source, or gate to drain, voltage potential of the protection circuits within a safe operating range. Such a pull up resistive element is operatively coupled to the overshoot protection circuit and undershoot protection circuit to allow tracking of the bias voltage of the overshoot protection circuit and undershoot protection circuit. In addition, another embodiment includes a floating level clamping circuit, such as a pair of parallel coupled diodes (such as MOS transistors configured as diodes) coupled in reverse directions, and coupled to the overshoot protection circuit and the undershoot protection circuit to clamp the tracking bias voltage so as to avoid damage to transistors within the overshoot and undershoot protection circuits. In one embodiment, all of the transistors and diodes of the I/O pad voltage protection circuit are formed from a MOS single gate oxide thickness transistors to improve fabrication yields and reduce fabrication costs.

Figure 1:
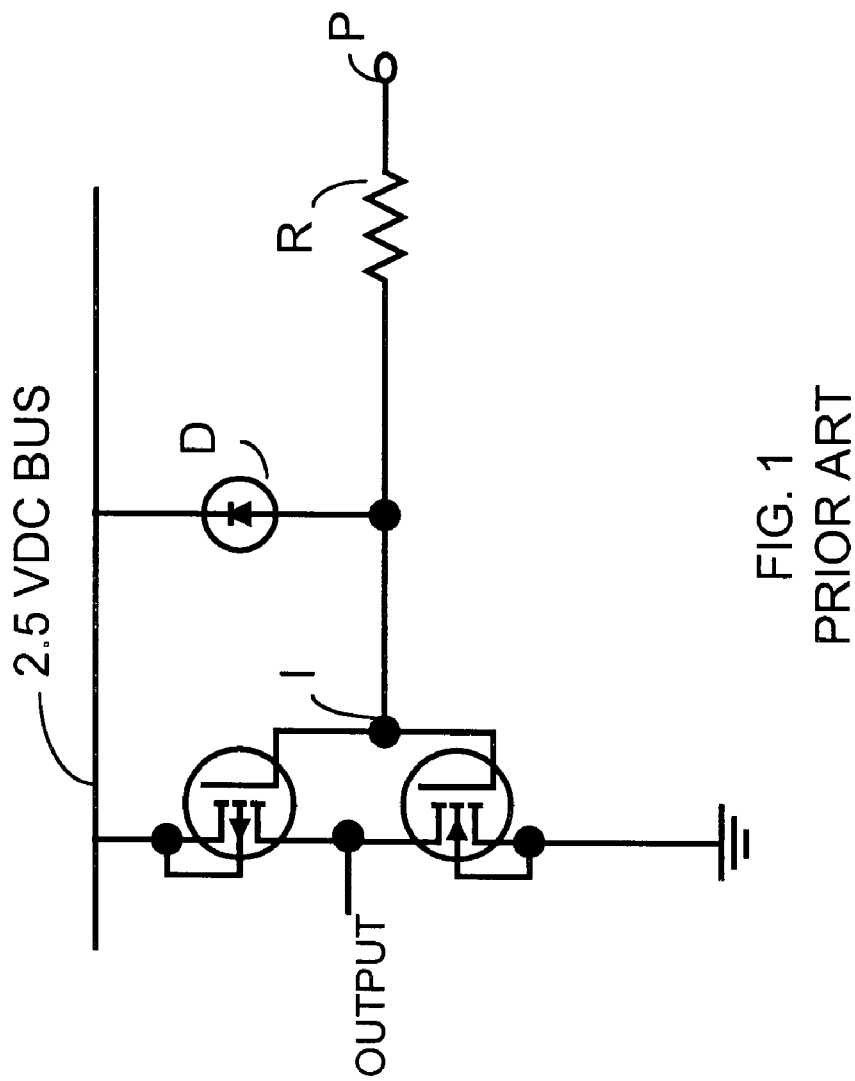
FIG. 1 is a prior art overvoltage protection arrangement.
Figure 2:
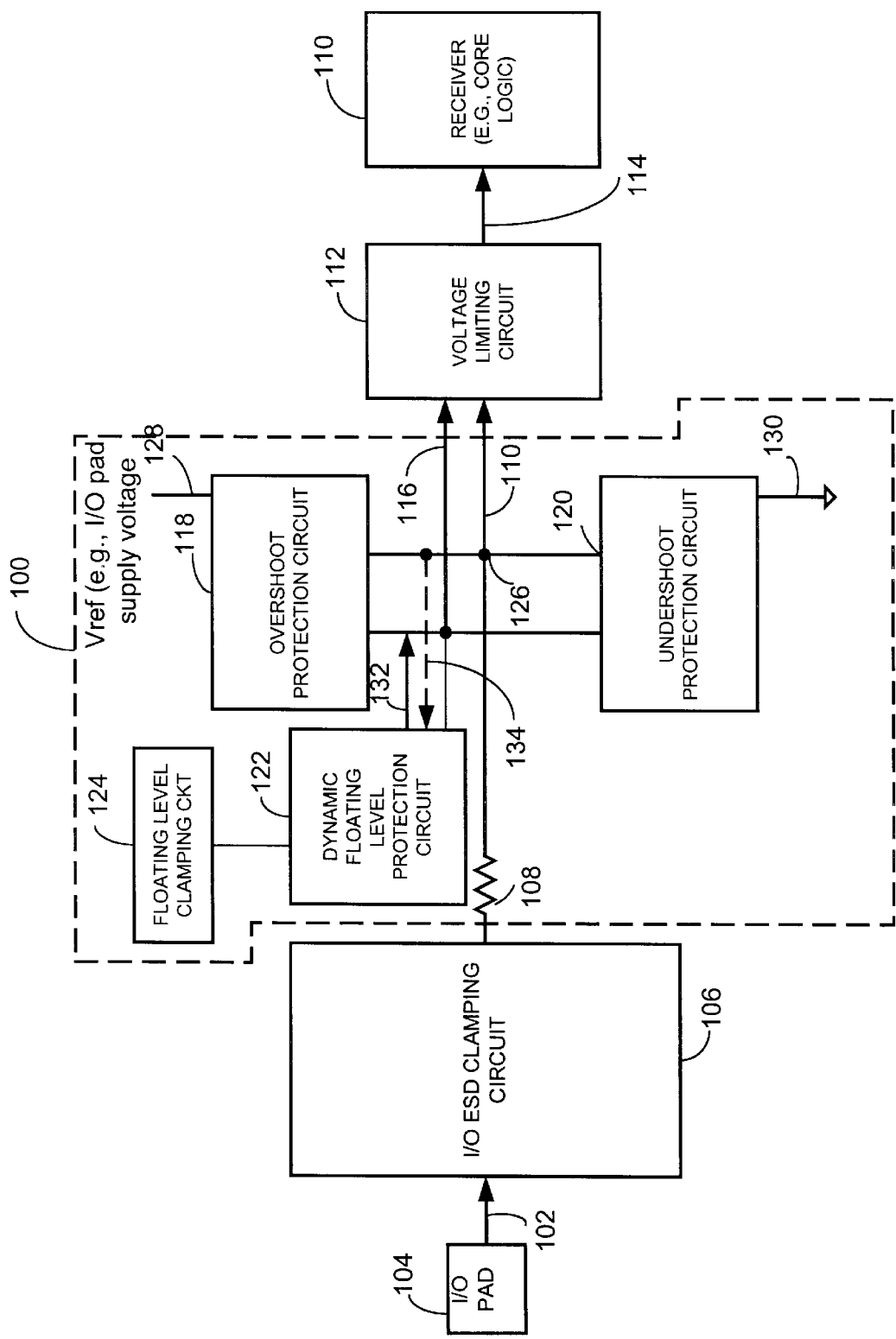
FIG. 2 is a block diagram illustrating one embodiment of an I/O pad voltage protection circuit in accordance with one embodiment of the invention.

FIG. 2 illustrates one example of an I/O pad voltage protection circuit 100 that receives an overvoltage input signal 102 through an I/O pad 104, such as a dietrace, pin, or any other suitable signal coupling mechanism. An I/O electrostatic discharge (ESD) clamping circuit 106 provides initial clamping of the overvoltage signal 102 as known in the art. An isolation resistor 108 further isolates receiver logic 110 from the overvoltage input signal 102, also as known in the art. As used in this particular example, the overvoltage signal 102 may be, for example, a signal that can rise above an I/O pad supply voltage and go negative below an I/O ground voltage. For example, this range may be −0.8 V to 4.1 V, where the I/O pad supply voltage is 3.3 V, the core logic supply voltage is 1.8 V and ground is considered to be 0 V. However, it will be recognized that any suitable overvoltage signal may also be suitably clamped by the disclosed circuit and method.

The I/O pad voltage protection circuit 100 provides a clamped input voltage 110 to a voltage limiting circuit 112. The voltage limiting circuit 112 then outputs a received signal 114 at a suitable level safe for a receiver circuit 110. In this embodiment, the I/O pad voltage protection circuit 100 also outputs a control signal 116 for the voltage limiting circuit 112.

The I/O pad voltage protection circuit 100 includes an overshoot protection circuit 118 and an undershoot protection circuit 120. In addition, if desired, the I/O pad voltage protection circuit may include a dynamic floating level protection circuit 122 and a floating level clamping circuit 124. The overshoot protection circuit 118 controls overshoot current sinking to provide the clamped input voltage 110 at node 126 to be approximately equal to an I/O pad supply voltage 128 or other suitable reference voltage during overshoot conditions. This is done as a function of an internally generated reference voltage generated by a reference voltage generating circuit. The overshoot protection circuit 118 also provides the control signal 116 for the voltage limiting circuit 112.

The undershoot protection circuit 120 controls undershoot current sinking to provide a clamped voltage 110 approximately equal to an I/O pad ground voltage 130 during undershoot conditions. This is done as a function of a reference voltage generated by an internal reference voltage generating circuit. Hence, when the overvoltage signal 102 includes an overshoot portion, such as a level exceeding the I/O pad supply voltage, the overshoot protection circuit 118 clamps the input voltage 102 to a I/O pad supply voltage or other suitable level. Similarly, when the overvoltage signal 102 includes an undershoot signal, such as a negative voltage, the undershoot protection circuit 120 clamps the undershoot portion to a level that does not exceed the ground potential 130, or other suitable level.

The dynamic floating level protection circuit 122 provides a dynamically floating reference signal 132 to both the overshoot protection circuit 118 and the undershoot protection circuit 120. This dynamically floating reference signal 132 serves as a type of tracking signal that is used to provide a gate to source, or gate to drain, voltage potential for transistors within the overshoot protection circuit 118 and within the undershoot protection circuit 120, within a safe operating range. The dynamic floating level protection circuit 122 senses the clamped input signal 110 through overshoot protection 118 and undershoot protection circuit 120 through a capacitive coupling as shown by dashed line 134.

Where the dynamic floating level protection circuit 132 is insufficient to protect transistors within its own protection circuit or within the overshoot protection circuit 118 and the undershoot protection circuit 120, the dynamic floating level protection circuit 122 is further clamped by the floating level clamping circuit 124. The floating level clamping circuit 124 may be operatively coupled in parallel with the dynamic floating protection circuit 122, or may be coupled in any suitable manner.

Figure 3:
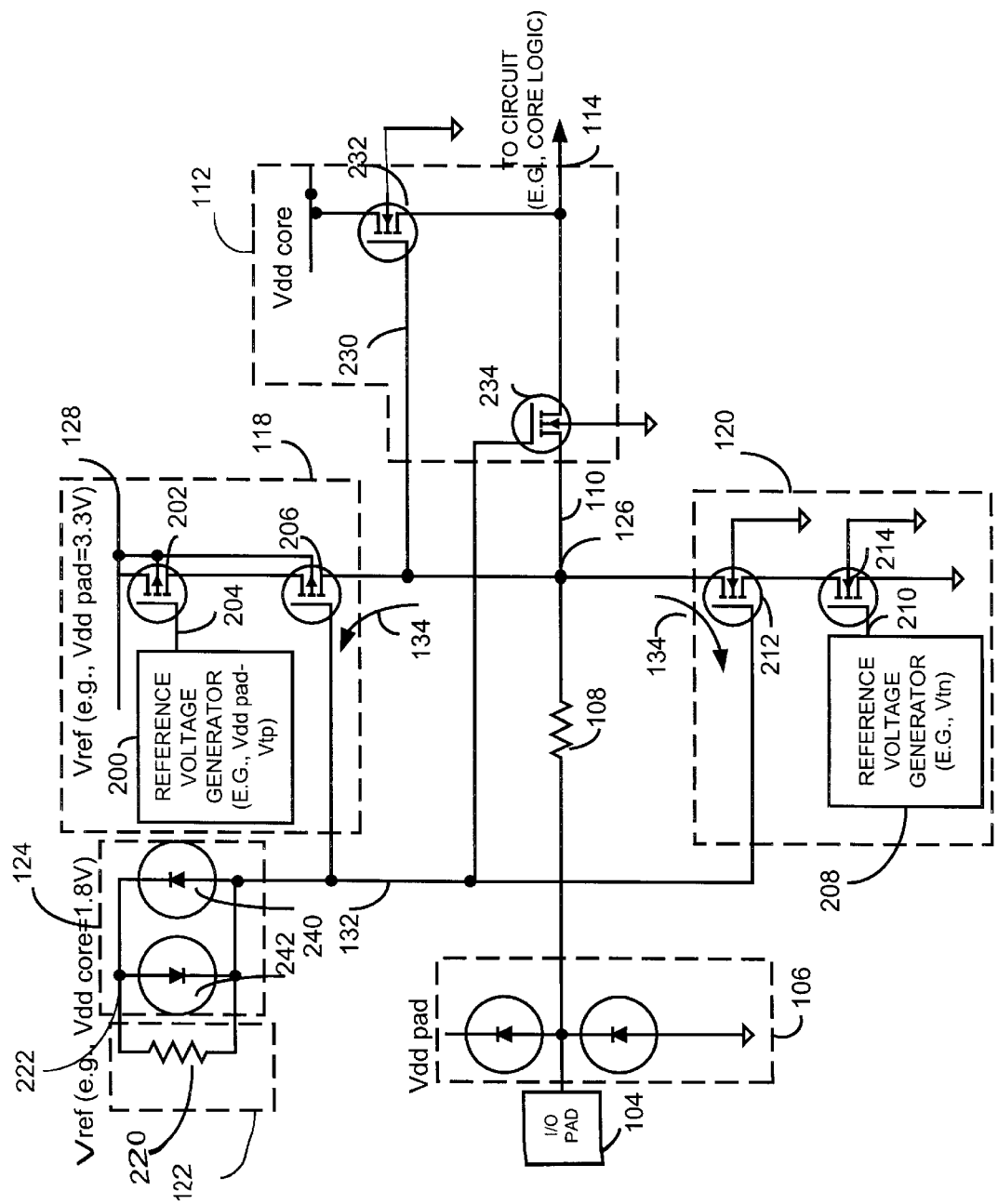
FIG. 3 is a circuit diagram illustrating one example of an I/O pad voltage protection circuit of FIG. 2 in accordance with one embodiment of the invention.

Referring to FIG. 3, one example of the overshoot protection circuit 118 includes a reference voltage generating circuit 200 that is operatively coupled to a first transistor 202. The first transistor 202 is operatively coupled to I/O pad supply voltage 128 or any other suitable reference voltage and also receives a first reference voltage 204 from the reference voltage generating circuit 200. The overshoot protection circuit 118 also includes a second transistor 206 that is operatively coupled to the first transistor 202 and to the node 126.

One example of the undershoot protection circuit 120 includes a second reference generating circuit 208 that generates a second reference voltage 210. The undershoot protection circuit 120 also includes a third transistor 212 and a fourth transistor 214. The third transistor 212 is operatively coupled to transistor 206 of the overshoot protection circuit 118 and to the node 126. The fourth transistor 214 is coupled to receive the second reference voltage 210 and is also operatively coupled to third transistor 212. As shown, the transistors may be pmos and nmos devices, however any suitable devices may be used.

The floating level protection circuit 122 includes a resistive element 220 such as a 3k resistor that has one terminal coupled to a reference voltage 222, such as the core logic supply voltage, and has another terminal operatively coupled to a gate of the second and third transistors 206 and 212, respectively. The floating level protection circuit 122 provides the dynamically floating reference signal 132 to the overshoot protection circuit 118 and the undershoot protection circuit 120 through transistors 206 and 212. The dynamically floating reference signal 132, during an overshoot condition, provides a gate to source potential for the second transistor 206 within a safe operating range. During undershoot conditions, the dynamically floating reference signal decreases to provide a gate to drain voltage potential for the third transistor 212 within a safe operating range.

More particularly, the overshoot protection circuit 118 has the first transistor 202 with a gate operatively coupled to receive the reference voltage 204, a drain operatively coupled to a source of transistor 206 and a source operatively coupled to another reference voltage, such as the I/O pad supply voltage 128. The second transistor 206 has a drain operatively coupled to a node 126 to provide a clamped input voltage 110 during overvoltage conditions. The second transistor 206 also has a drain operatively coupled to the drain of the third transistor 212 of the undershoot protection circuit 130. The transistor 206 may also be operatively coupled to provide a drive signal 230 to a voltage limiting transistor 232 in the voltage limiting circuit 112. The voltage limiting circuit 112 may be optional if the clamped input signal 110 is already within a suitable range for the receiver circuit.

The undershoot protection circuit 120 has the third transistor 212 with a source operatively coupled to a drain of the fourth transistor 214. The fourth transistor 214 has a gate operatively coupled to receive the reference voltage 210 and also has a source operatively coupled to another reference voltage such as the I/O ground voltage 130.

In this particular embodiment, the reference voltage generating circuit 200 generates the reference voltage 204 equal to VDD pad minus VTP. Also, the reference voltage generating circuit 208 generates the reference voltage 210 to be equal to the threshold voltage of the transistor 214, namely VTN to provide "ON" conditions for transistors 202 and 214 when the node 126 voltage is higher then Vdd Pad or lower than the ground voltage.

One example of the voltage limiting circuit 112 includes a pass transistor 234 which passes the clamped input voltage 110 to the receiver. The dynamic floating level protection circuit 122, the overshoot protection circuit 118 and the undershoot protection circuit 120 are operatively coupled to a gate of the pass transistor 234. As shown, the gate of the second transistor 206, and the gate of transistor 212 are operatively coupled to the gate of the pass transistor 234. The pass transistor 234 outputs an output voltage 114 to a circuit such as the receiver. The resistive element 108 is operatively coupled between the transistors 206 and 212 and the incoming signal 102.

The dynamic floating level protection circuit 122 receives the clamped input signal 110 through the overshoot protection circuit 118 and undershoot protection circuit 120 in a capacitive coupling through the transistors 206 and 212, respectively. For example, during overvoltage conditions, the parasitic capacitance of transistor 206 will couple the voltage during overvoltage conditions as well as the parasitic capacitance across the gate to source of transistor 212. The resistor 220 in combination with the parasitic capacitances of the transistors 206 and 212 form a type of RC filter.

The floating level clamping circuit 124 in this particular embodiment, includes a first diode 240 and a second diode 242 (MOS transistors configured as diodes in this particular embodiment). The diodes are coupled in parallel and in an opposite direction of one another. In addition, the floating level clamping circuit 124 is operatively coupled in parallel with resistor 220. However, any suitable floating level clamping circuit may also be used that clamps the floating level signal 132 at a desired maximum level during overvoltage conditions. In this case, the dynamically floating reference signal 132 is clamped by the floating level clamping circuit 124 to a level of approximately +/−0.5 V (MOS transistors threshold voltage) within the level of the VDD core voltage during both overvoltage and undervoltage conditions. Accordingly, the gate to drain of the pass transistor 234 is protected against overshoot damage from the use of, among other things, a RC filter formed by resistor 220 and the capacitance of the gate to source and gate to drain properties of transistors 206 and 212. The reference voltage 204 and reference voltage 210 are used during overshoot or undershoot conditions such that, for example, during an overshoot condition, when the node 126 is more than the I/O supply voltage, transistor 214 is off and if the node 126 increases above the pad supply voltage due to an overshoot condition, transistor 202 is turned on sending current through transistor 206 to the I/O voltage supply. As such, the overshoot protection circuit clamps during overshoot conditions. The transistor 206 is effectively always "ON" as well as transistor 212. Transistor 202 is only "ON" during overshoot conditions. Transistor 214 is only "ON" during undershoot conditions. The resistor 108 allows a voltage drop to occur during overshoot or undershoot conditions.

If during an overshoot condition, the overshoot voltage is high enough, the gate to drain or gate to sources of these devices 206, 212 and 234 may be too high and cause damage to these devices. To protect these devices during: high overshoot conditions, the floating level protection circuit varies the floating reference signal 132 to track the level and direction of the overshoot or undershoot voltage levels. This then raises or lowers the potential of the necessary points to ensure that a gate to source or gate to drain level is within normal operating conditions. Additional protection is provided by the floating level clamping circuit 124 during overshoot and undershoot conditions, for example, to limit the level of the dynamically floating reference signal 132 within the level of VDD core voltage +/−0.5V (threshold voltage of MOS transistors in diode configurations).

For example, if the overshoot becomes too high, diode 240 turns on to protect the gate to source of transistors 206, 234 and 212. During undershoot conditions, transistor 202 is effectively off and there is no current through transistors 206 and 202. Transistor 212 is "ON", and transistor 214 gets turned "ON" when its drain receives a voltage that is negative compared to the ground potential. The transistors 212 and 214 attempt to keep the drain voltage seen at transistor 214 to approximately 0 V (the ground potential). If the node 126 goes negative, the gate to source potential of the transistors 212, 206 and gate to drain of transistor 234 can be damaged. Accordingly, diode 242 then clamps during the negative voltage conditions to provide additional protection.

Figure 4B:
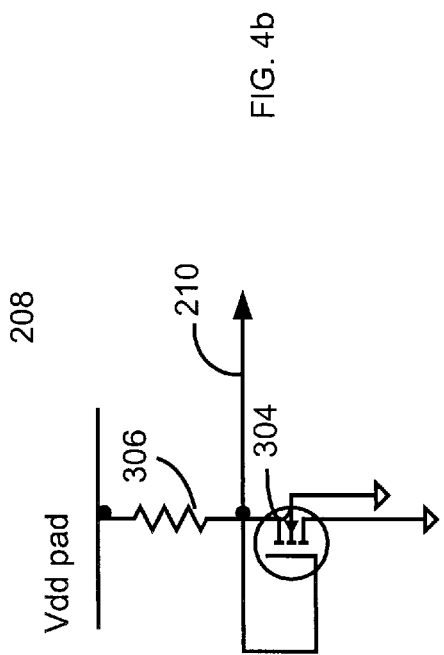
FIGS. 4a and 4b are circuit diagrams illustrating one example of reference voltage generating circuits in accordance with one embodiment of the invention.
Figure 4A:
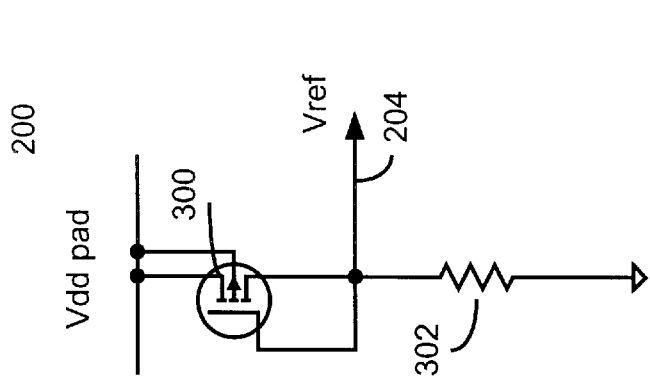

FIGS. 4a and 4b represent examples of reference voltage generating circuits 200 and 208, respectively. As shown, the reference voltage generating circuit 200 may include a pmos transistor 300 having a source operatively coupled to the pad supply voltage and both a drain and a gate operatively coupled to a resistor 302. The resistor may be, for example, on the order of 100k or any suitable value to generate, for example, a reference voltage equal to VDD pad minus VTP.

Similarly, the reference voltage generating circuit 208 includes an nmos transistor 304 having a drain and a gate operatively coupled to resistor 206 when a terminal of resistor 306 is operatively coupled to the VDD pad. The drain of the transistor 304 provides the reference voltage 210. This reference voltage is approximately equal to VTN.

Each of the transistors and diodes shown in the figures are single gate oxide MOS transistors, such as 30A gate oxide thicknesses for 0.18 um technology processes. In addition, the core logic is also made of the single gate oxide thickness devices to provide a die that has all single gate devices to increase yield and decrease cost, while improving speed due to these deep submicron gate thicknesses.

Accordingly, the above circuits and methods protect gate to source and gate to drain voltages to be within normal operating voltages when there are varying supply voltages, and overshoot and undershoot voltages received, for example, on an I/O pad. In addition to the ESD protection, which typically clamps at a level above a supply voltage, the disclosed system provides a suitable clamp level at or below the I/O pad supply voltage. In effect, the system provides three additional levels of protection by, for example, having undershoot protection and overshoot protection due to the overshoot and undershoot protection circuits. Another level of protection may be provided by the floating level protection circuit which provides a dynamically varying tracking voltage to the overshoot and undershoot protection circuits. A third level of protection may be derived from the floating level clamping circuit which limits the level of the input voltage to a point at or below the I/O supply voltage.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. An I/O pad voltage protection circuit comprising:
    an overshoot protection circuit including a first reference voltage generating circuit, that controls overshoot current sinking to provide a clamp voltage at a first node approximately equal to an I/O pad supply voltage during overshoot conditions, as a function of a first reference voltage generated by the first reference voltage generating circuit;
    an undershoot protection circuit including a second reference voltage generating circuit, that controls undershoot current sinking to provide a clamp voltage approximately equal to an I/O pad ground voltage during undershoot conditions, as a function of a second reference voltage generated by the second reference voltage generating circuit; and
    including a floating level protection circuit operatively coupled to the overshoot protection circuit and to the undershoot protection circuit, that provides a dynamically floating reference signal to the overshoot protection circuit and to the undershoot protection circuit to provide a gate to source or gate to drain voltage potential within a safe operating range for at least one transistor in each of the overshoot protection circuit and the undershoot protection circuit.

2. The I/O pad voltage protection circuit of claim 1 wherein the overshoot protection circuit includes:
    a first transistor operatively coupled to the first reference voltage and the I/O pad supply voltage; and
    a second transistor operatively coupled to the first transistor and to the first node.

3. The I/O pad voltage protection circuit of claim 2 wherein the undershoot protection circuit includes:
    a third transistor operatively coupled to the second transistor and to the first node; and
    a fourth transistor operatively coupled to the second reference voltage and to the third transistor.

4. The I/O pad voltage protection circuit of claim 3 including a floating level protection circuit that includes a resistive element and wherein the first and second transistors are pmos transistors, the third and fourth transistors are nmos transistors, and wherein one terminal of the resistive element is coupled to a reference voltage and another terminal is operatively coupled to a gate of the second and third transistors such that the floating level protection circuit provides a dynamically floating reference signal to the overshoot protection circuit and to the undershoot protection circuit to provide a gate to source potential of the second transistor and a gate to drain voltage potential of the third transistor within a safe operating range.

5. The I/O pad voltage protection circuit of claim 4 wherein:
    the first transistor has a gate operatively coupled to the first reference voltage, a drain operatively coupled to a source of the second transistor and a source operatively coupled to the I/O pad supply voltage;
    the second transistor has a drain operatively coupled to the node and to a drain of the third transistor;
    the third transistor has a source operatively coupled to a drain of the fourth transistor; and wherein
    the fourth transistor has a gate operatively coupled to the second reference voltage and a source coupled to ground.

6. The I/O pad voltage protection circuit of claim 4 wherein the gate of the second and third transistors are also operatively coupled to a pass transistor for outputting a output voltage to a circuit and wherein another resistive element is operatively coupled between the second and third transistors and an incoming overvoltage signal.

7. The I/O pad voltage protection circuit of claim 1 wherein the floating level protection circuit includes a resistive element operatively coupled to a reference voltage, to a gate of a transistor associated with the overshoot protection circuit and to a gate of a transistor associated with the undershoot protection circuit.

8. An I/O pad voltage protection circuit comprising:
    an overshoot protection circuit operatively coupled to receive an overvoltage input signal and operatively coupled to source current during overshoot conditions;
    an undershoot protection circuit operatively coupled to receive the overvoltage input signal and operatively coupled to sink current during undershoot conditions;
    a floating level protection circuit operatively coupled to the overshoot protection circuit and to the undershoot protection circuit, that provides a dynamically floating reference signal to the overshoot protection circuit and to the undershoot protection circuit to provide a gate to source or gate to drain voltage potential within a safe operating range for at least one transistor in each of the overshoot protection circuit and the undershoot protection circuit; and
    a floating level clamping circuit operatively coupled to the overshoot protection circuit and the undershoot protection circuit.

9. The I/O pad voltage protection circuit of claim 8 wherein the floating level clamping circuit includes a first diode operatively coupled in parallel and in an opposite direction to a second diode.

10. The I/O pad voltage protection circuit of claim 8 wherein the overshoot protection circuit includes:

a first transistor operatively coupled to the first reference voltage and the I/O pad supply voltage; and a second transistor operatively coupled to the first transistor and to the first node.

11. The I/O pad voltage protection circuit of claim 10 wherein the undershoot protection circuit includes:

a third transistor operatively coupled to the second transistor and to the first node; and a fourth transistor operatively coupled to the second reference voltage and to the third transistor.

12. The I/O pad voltage protection circuit of claim 11 including a floating level protection circuit that includes a resistive element and wherein the first and second transistors are pmos transistors, the third and fourth transistors are nmos transistors, and wherein one terminal of the resistive element is coupled to a reference voltage and another terminal is operatively coupled to a gate of the second and third transistors such that the floating level protection circuit provides a dynamically floating reference signal to the overshoot protection circuit and to the undershoot protection circuit to provide a gate to source potential of the second transistor and a gate to drain voltage potential of the third transistor within a safe operating range.

13. The I/O pad voltage protection circuit of claim 12 wherein:

the first transistor has a gate operatively coupled to the first reference voltage, a drain operatively coupled to a source of the second transistor and a source operatively coupled to the I/O pad supply voltage;

the second transistor has a drain operatively coupled to the node and to a drain of the third transistor;

the third transistor has a source operatively coupled to a drain of the fourth transistor; and wherein the fourth transistor has a gate operatively coupled to the second reference voltage and a source coupled to ground.

14. The I/O pad voltage protection circuit of claim 12 wherein the gate of the second and third transistors are also operatively coupled to a pass transistor for outputting a output voltage to a circuit and wherein another resistive element is operatively coupled between the second and third transistors and an incoming overvoltage signal.

15. The I/O pad voltage protection circuit of claim 8 including a floating level protection circuit operatively coupled to the overshoot protection circuit and to the undershoot protection circuit, that provides a dynamically floating reference signal to the overshoot protection circuit and to the undershoot protection circuit to provide a gate to source or gate to drain voltage potential within a safe operating range for at least one transistor in each of the overshoot protection circuit and the undershoot protection circuit.

16. The I/O pad voltage protection circuit of claim 15 wherein the floating level protection circuit includes a resistive element operatively coupled to a reference voltage, to a gate of a transistor associated with the overshoot protection circuit and to a gate of a transistor associated with the undershoot protection circuit.

17. A method for I/O pad voltage protection comprising the steps of:

controlling overshoot current sinking to provide a clamp voltage at a first node approximately equal to an I/O pad supply voltage during overshoot conditions; as a function of a first reference voltage generated by the first reference voltage generating circuit;

controlling undershoot current sinking to provide a clamp voltage approximately equal to an I/O pad ground voltage during undershoot conditions, as a function of a second reference voltage generated by the second reference voltage generating circuit; and providing a dynamically floating reference signal to an overshoot protection circuit and to an undershoot protection circuit to provide a gate to source or gate to drain voltage potential within a safe operating range for at least one transistor in each of the overshoot protection circuit and the undershoot protection circuit.

18. The method of claim 17 including the step of providing a floating level clamp for the overshoot protection circuit and the undershoot protection circuit.

* * * * *